United States Patent
Kim et al.

(10) Patent No.: US 12,340,092 B2
(45) Date of Patent: Jun. 24, 2025

(54) ELECTRONIC DEVICE CONTROLLING AN OPERATION OF A VOLATILE MEMORY AND METHOD FOR OPERATING THE SAME

(71) Applicant: Samsung Electronics Co., Ltd., Suwon-si (KR)

(72) Inventors: Jeyoon Kim, Suwon-si (KR); Hakhyeon Kim, Suwon-si (KR); Minjung Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 19 days.

(21) Appl. No.: 17/981,145

(22) Filed: Nov. 4, 2022

(65) Prior Publication Data

US 2023/0133234 A1    May 4, 2023

Related U.S. Application Data

(63) Continuation of application No. PCT/KR2022/016999, filed on Nov. 2, 2022.

(30) Foreign Application Priority Data

Nov. 4, 2021   (KR) .................. 10-2021-0150436
Dec. 7, 2021   (KR) .................. 10-2021-0173984

(51) Int. Cl.
   *G06F 3/06* (2006.01)
(52) U.S. Cl.
   CPC .......... *G06F 3/0619* (2013.01); *G06F 3/0617* (2013.01); *G06F 3/0653* (2013.01); *G06F 3/0673* (2013.01)
(58) Field of Classification Search
   CPC ...... G05B 13/00–048; G05B 15/00–02; G05B 17/00–02; G06F 1/00–3296;
   (Continued)

(56) References Cited

U.S. PATENT DOCUMENTS 6,484,232 B2 * 11/2002 Olarig ................. G11C 11/4078
                                                     714/42
7,872,494 B2 *  1/2011 Welker ................... H04L 25/08
                                                     365/198
(Continued)

FOREIGN PATENT DOCUMENTS

CN    104750589 A    7/2015
JP    2021-043907 A  3/2021
(Continued)

OTHER PUBLICATIONS

Definition of adjacent, Merriam-Webster Online Dictionary, retrieved from http://www.merriam-webster.com/dictionary/adjacent on Feb. 13, 2015 (1 page) (Year: 2015).*

(Continued)

*Primary Examiner* — Daniel C. Chappell
(74) *Attorney, Agent, or Firm* — Jefferson IP Law, LLP

(57) ABSTRACT

An electronic device is provided. The electronic device includes a storage, a volatile memory, and a processor, wherein the processor is configured to identify temperature information based on a temperature of the volatile memory and a temperature of the processor, to identify a first temperature section corresponding to the temperature information among a plurality of predetermined temperature sections, to perform calibration of the volatile memory to acquire an operation parameter corresponding to the first temperature section, and to adjust a timing between signals for controlling an operation of the volatile memory based on the operation parameter.

19 Claims, 11 Drawing Sheets

US 12,340,092 B2
Page 2

(58) Field of Classification Search
CPC ............... G06F 3/00; G06F 3/06–0689; G06F
5/00–16; G06F 8/00–78; G06F 9/00–548;
G06F 11/00–3696; G06F 12/00–16; G06F
13/00–4295; G06F 15/00–825; G06F
16/00–986; G06F 18/00–41; G06F
17/00–40; G06F 21/00–88; G06F
2009/3883; G06F 2009/45562–45595;
G06F 2015/761–768; G06F 2201/00–885;
G06F 2206/00–20; G06F 2209/00–549;
G06F 2211/00–902; G06F 2212/00–7211;
G06F 2213/00–4004; G06F 2216/00–17;
G06F 2221/00–2153; G06N 3/00–126;
G06N 5/00–048; G06N 7/00–08; G06N
10/00; G06N 20/00–20; G06N
99/00–007; G06T 1/00–60; G06V
30/00–43; G11B 20/00–24; G11B
33/00–1493; G11C 11/00–5692; G11C
13/00–06; G11C 14/00–009; G11C
15/00–06; G11C 16/00–3495; G11C
17/00–18; G11C 2207/00–229; G11C
2216/00–30; H01L 25/00–50; H01L
2225/00–1094; H03M 7/00–707; H04L
9/00–38; H04L 12/00–66; H04L
41/00–5096; H04L 49/00–9094; H04L
61/00–59; H04L 67/00–75
See application file for complete search history.

(56) References Cited

U.S. PATENT DOCUMENTS

| | | | | |
|---|---|---|---|---|
| 8,171,329 B2* | 5/2012 | Ping | ............ | G06F 1/10 713/401 |
| 8,432,768 B2* | 4/2013 | Ware | ............ | G11C 7/10 365/189.011 |
| 9,053,015 B2* | 6/2015 | Vasilyuk | ............ | G06F 3/0656 |
| 9,342,443 B2* | 5/2016 | Walker | ............ | G06F 12/023 |
| 11,482,989 B2* | 10/2022 | Gans | ............ | H03H 11/28 |
| 2003/0210598 A1* | 11/2003 | Alexander | ............ | G11C 5/147 365/211 |
| 2003/0235084 A1* | 12/2003 | Zumkehr | ............ | G11C 29/028 365/189.05 |
| 2004/0199730 A1* | 10/2004 | Eggers | ............ | G06F 1/3225 711/105 |
| 2005/0105349 A1* | 5/2005 | Dahlberg | ............ | G11C 7/1078 365/201 |
| 2005/0135430 A1* | 6/2005 | Le | ............ | G11C 7/22 370/537 |
| 2005/0201188 A1* | 9/2005 | Donze | ............ | G11C 7/04 365/232 |
| 2006/0018203 A1* | 1/2006 | Kosaka | ............ | G06F 1/206 369/13.24 |
| 2007/0191993 A1* | 8/2007 | Wyatt | ............ | G11C 5/00 257/E23.08 |
| 2008/0005475 A1* | 1/2008 | Lubbers | ............ | G06F 3/0644 711/118 |
| 2009/0299543 A1* | 12/2009 | Cox | ............ | G06F 1/206 713/300 |
| 2010/0169585 A1* | 7/2010 | Steinbrecher | ............ | G06F 1/206 711/E12.001 |
| 2011/0102073 A1* | 5/2011 | Riho | ............ | H04L 25/0278 327/541 |
| 2011/0235763 A1* | 9/2011 | Palmer | ............ | G11C 7/1072 375/362 |
| 2012/0284576 A1 | 11/2012 | Housty et al. | | |
| 2013/0091348 A1* | 4/2013 | Kwon | ............ | G05B 15/02 713/100 |
| 2014/0032890 A1* | 1/2014 | Lee | ............ | G11C 7/20 713/2 |
| 2014/0359196 A1 | 12/2014 | Ragland et al. | | |
| 2015/0049536 A1* | 2/2015 | Oh | ............ | G11C 13/0038 365/148 |
| 2015/0310938 A1 | 10/2015 | Kim et al. | | |
| 2016/0284386 A1* | 9/2016 | McCall | ............ | G11C 29/50008 |
| 2017/0083259 A1 | 3/2017 | Lee et al. | | |
| 2018/0167055 A1 | 6/2018 | Gans | | |
| 2018/0342309 A1 | 11/2018 | Griffin | | |
| 2018/0349243 A1 | 12/2018 | Shin et al. | | |
| 2019/0294336 A1 | 9/2019 | Griffin | | |
| 2020/0202957 A1* | 6/2020 | Terada | ............ | G11C 16/26 |
| 2020/0393993 A1* | 12/2020 | Sicola | ............ | G06F 3/0659 |
| 2021/0064390 A1* | 3/2021 | Park | ............ | G06N 5/02 |
| 2021/0081109 A1* | 3/2021 | Wang | ............ | G11C 29/028 |
| 2022/0164229 A1* | 5/2022 | Sahasranamam | ....... | G06F 9/505 |
| 2022/0164262 A1* | 5/2022 | Vainikka | ............ | G06F 3/0673 |

FOREIGN PATENT DOCUMENTS

| | | |
|---|---|---|
| KR | 10-2011-0111445 A | 10/2011 |
| KR | 10-2015-0128907 A | 11/2015 |
| KR | 10-2017-0035150 A | 3/2017 |
| KR | 10-2021-0026353 A | 3/2021 |
| KR | 10-2021-0035924 A | 4/2021 |
| KR | 10-2021-0157748 A | 12/2021 |
| WO | 2004/102389 A1 | 11/2004 |

OTHER PUBLICATIONS

D. Shim et al., "A Process-Variation-Tolerant On-Chip CMOS Thermometer for Auto Temperature Compensated Self-Refresh of Low-Power Mobile DRAM," in IEEE Journal of Solid-State Circuits, vol. 48, No. 10, pp. 2550-2557, Oct. 2013, doi: 10.1109/JSSC.2013.2272338. (Year: 2013).*

S. S. Jha, A. J. Krdu and M. Malek, "Minimizing Restart Time for Fast Rejuvenation and Availability Enhancement," 2011 Tenth International Symposium on Autonomous Decentralized Systems, Tokyo, Japan, 2011, pp. 625-630, doi: 10.1109/ISADS.2011.89. (Year: 2011).*

International Search report dated Feb. 3, 2023, issued in International Patent Application No. PCT/KR2022/016999.

Extended European Search Report dated Nov. 28, 2024; European Appln. No. 22890355.5-1211 / 4390925 PCT/KR2022016999.

* cited by examiner

ELECTRONIC DEVICE CONTROLLING AN OPERATION OF A VOLATILE MEMORY AND METHOD FOR OPERATING THE SAME

CROSS-REFERENCE TO RELATED APPLICATION(S)

This application is a continuation application, claiming priority under § 365(c), of an International application No. PCT/KR2022/016999, filed on Nov. 2, 2022, which is based on and claims the benefit of a Korean patent application number 10-2021-0150436, filed on Nov. 4, 2021, in the Korean Intellectual Property Office, and of a Korean patent application number 10-2021-0173984, filed on Dec. 7, 2021, in the Korean Intellectual Property Office, the disclosure of each of which is incorporated by reference herein in its entirety.

TECHNICAL FIELD

The disclosure relates to an electronic device configured to control operations of a volatile memory, and a method for operating the same. The disclosure relates to an electronic device and a method for operating the same, wherein a volatile memory calibration operation is performed without performing system rebooting.

BACKGROUND ART

In line with development of electronic technologies, various kinds of electronic devices have been developed and widely used. More particularly, there has recently been widespread use of portable electronic devices having various functions, such as smartphones and tablet personal computers (PCs). Widespread use of portable electronic devices has been followed by higher levels of technologies applied to electronic devices and higher degrees of integration of components of electronic devices.

An electronic device, which has highly integrated components, may include a high-performance application processor (AP) and a volatile memory (for example, dynamic random access memory (DRAM)).

An electronic device including an AP and a volatile memory (for example, DRAM) may be affected by operations between the AP and the volatile memory, according to the internal temperature of the system. Particularly, signals for performing operations between the AP and the volatile memory may be sensitive to the internal temperature of the system.

In addition, the volatile memory (for example, DRAM), if exposed to a high-temperature state or low-temperature state outside a normal temperature range for a long period of time, may deviate from the operating range initially configured through a calibration operation (for example, a double data rate (DDR) training), and this may result in various types of malfunctions. For example, if margins related to clock signals and commands transmitted/received between the AP and the volatile memory deviate from preconfigured operating ranges, the volatile memory (for example, DRAM) may access a wrong address, thereby causing various malfunctions.

The above information is presented as background information only to assist with an understanding of the disclosure. No determination has been made, and no assertion is made, as to whether any of the above might be applicable as prior art with regard to the disclosure.

DETAILED DESCRIPTION OF THE INVENTION

Technical Problem

Existing electronic devices could perform functions for correcting refresh operations for maintaining data in memory cells included in a volatile memory, based on a temperature change. However, existing electronic devices could not perform functions for correcting operating parameters between an AP and a volatile memory (for example, DRAM) according to a temperature change.

Aspects of the disclosure are to address at least the above-mentioned problems and/or disadvantages and to provide at least the advantages described below. Accordingly, an aspect of the disclosure is to provide an electronic device and a method for operating the same, wherein a volatile memory calibration operation is performed without performing system rebooting, thereby acquiring an operation parameter regarding a temperature range corresponding to temperatures of the volatile memory and processor, and signals for performing operations between the processor and the volatile memory can be adjusted based on the acquired operation parameter.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a storage, a volatile memory, and at processor, wherein the processor is configured to identify temperature information based on a temperature of the volatile memory and a temperature of the processor, identify a first temperature section corresponding to the temperature information among a plurality of predetermined temperature sections, perform calibration of the volatile memory to acquire an operation parameter corresponding to the first temperature section, and adjust a timing between signals for controlling an operation of the volatile memory based on the operation parameter.

In accordance with another aspect of the disclosure, a method of operating an electronic device is provided. The method includes identifying temperature information based on a temperature of a volatile memory included in the electronic device and a temperature of a processor included in the electronic device, identifying a first temperature section corresponding to the temperature information among a plurality of predetermined temperature sections, acquiring an operation parameter corresponding to the first temperature section by performing calibration of the volatile memory, and adjusting a timing between signals for controlling an operation of the volatile memory based on the operation parameter.

In accordance with another aspect of the disclosure, a non-transitory recording medium that store a program is provided. The program is capable of performing identifying temperature information based on a temperature a volatile memory included in an electronic device and a temperature of a processor included in the electronic device, identifying a first temperature section corresponding to the temperature information among a plurality of predetermined temperature sections, acquiring an operation parameter corresponding to the first temperature section by performing calibration of the volatile memory, and adjusting a timing between signals for controlling an operation of the volatile memory based on the operation parameter.

Advantageous Effects

An electronic device according to various embodiments of the disclosure may apply an operation parameter optimized for temperatures of a processor and a volatile memory included in the electronic device to signals for performing the corresponding operation, thereby preventing performance degradation of the processor and the volatile memory due to temperatures.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
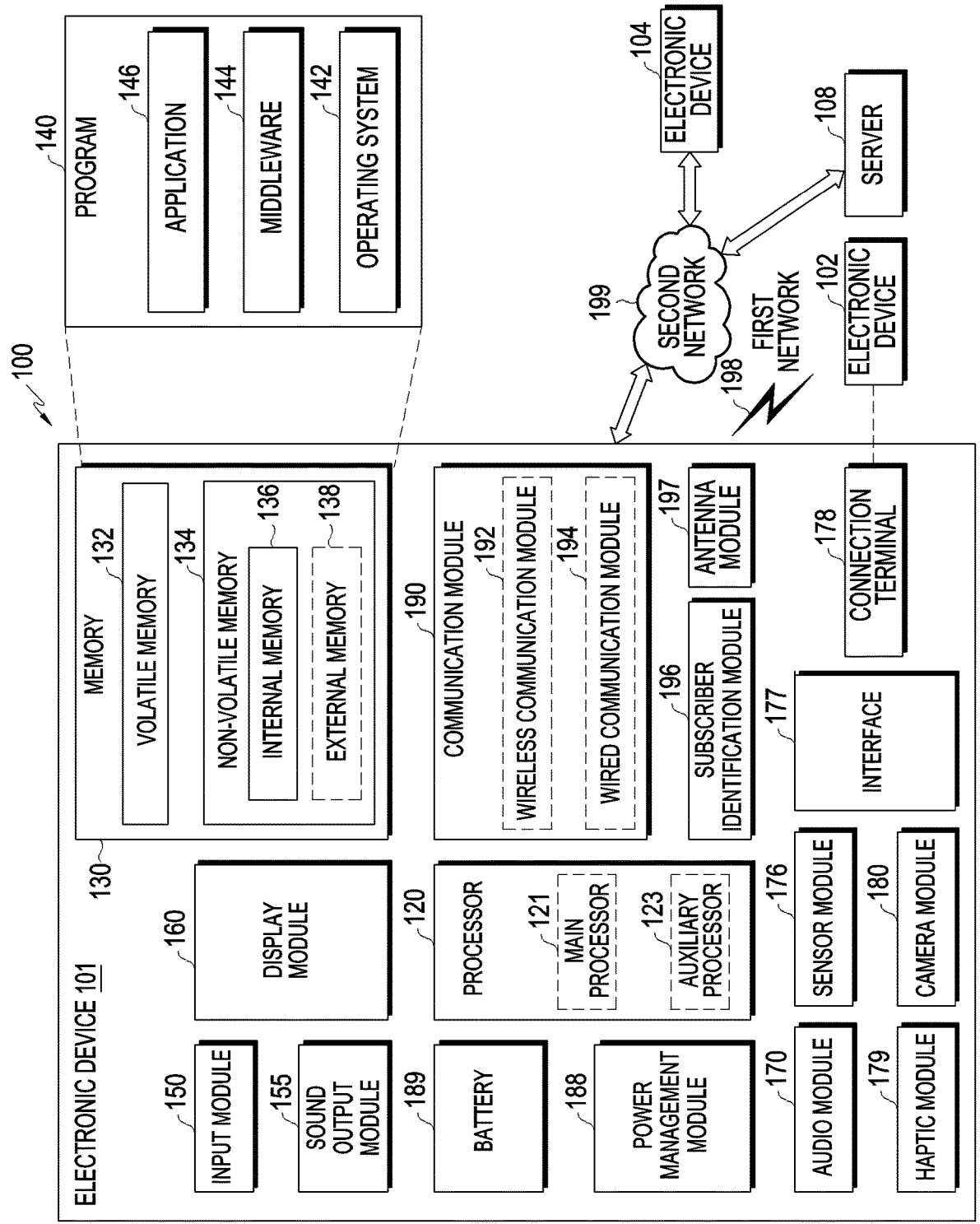
FIG. 1 is a block diagram illustrating an electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence model is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna.

The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing 1eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semipermanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
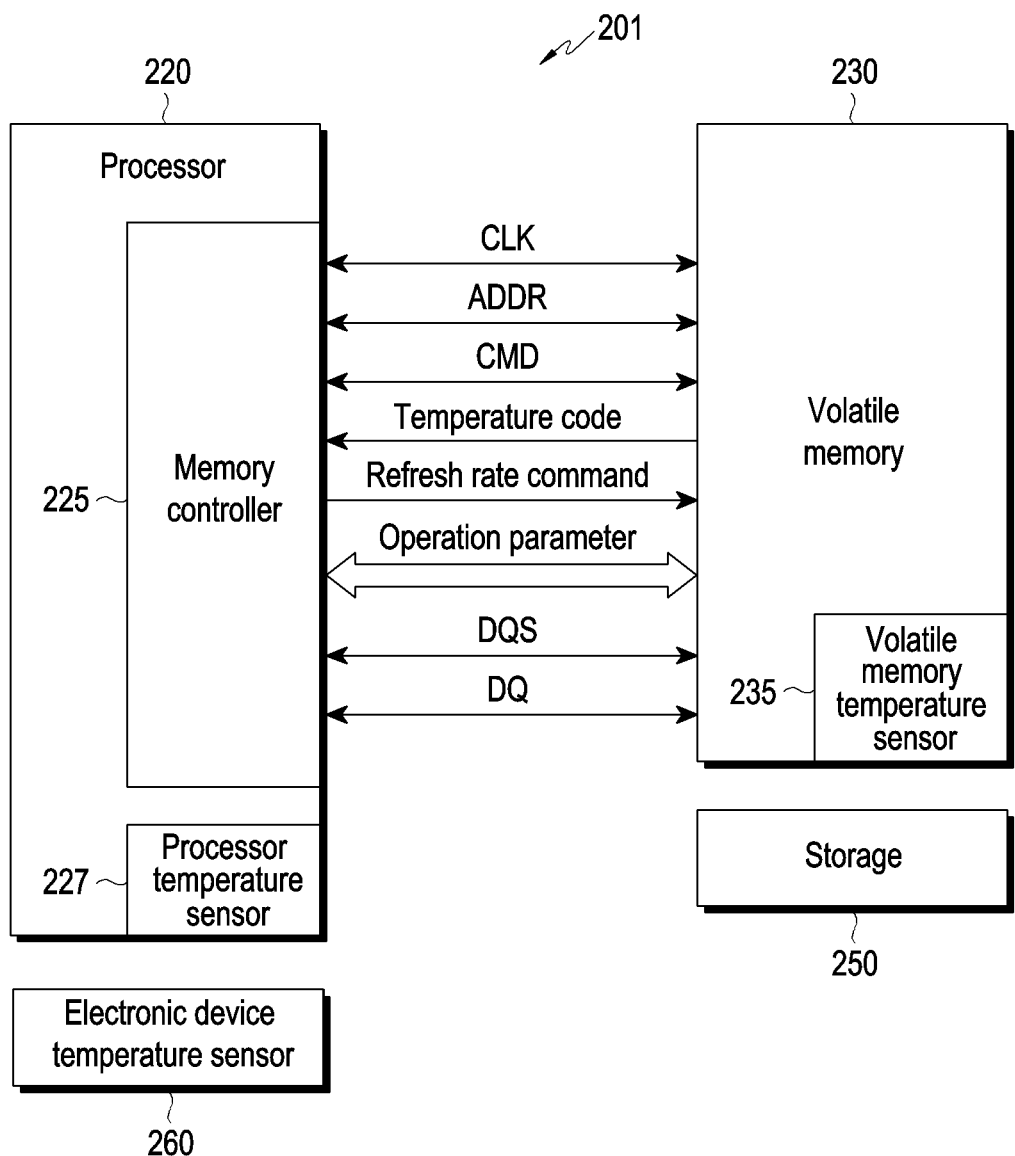
FIG. 2 is a schematic block diagram illustrating an electronic device according to an embodiment of the disclosure.

FIG. 2 is a schematic block diagram illustrating an electronic device according to an embodiment of the disclosure.

Referring to FIG. 2, according to various embodiments of the disclosure, an electronic device 201 may a processor 220, a volatile memory 230, and a storage 250. For example, the electronic device 201 may be implemented in the same or similar manner as or to the electronic device 101 of FIG. 1.

According to various embodiments of the disclosure, the processor 220 may control the overall operation of the electronic device 201. For example, the processor 220 may be implemented as an application processor (AP). The processor 220 may include a memory controller 225 and a processor temperature sensor 227.

According to various embodiments of the disclosure, the memory controller 225 may control the operation of the volatile memory 230 (e.g., the volatile memory 132 of FIG. 1). The memory controller 225 may transmit and receive various signals (or data) to and from the volatile memory 230. For example, the memory controller 225 may transmit and receive signals related to a clock CLK, address information ADDR, a command CMD (e.g., a read command or a write command), first data DQS, and second data DQ to and from the volatile memory 230. In addition, the memory controller 225 may receive code information (or a temperature code) indicating the temperature of the volatile memory 230 from the volatile memory 230. For example, the memory controller 225 may obtain code information indicating a temperature from a designated register of the volatile memory 230. The memory controller 225 may transmit a refresh rate command for refreshing (or maintaining) data stored in the volatile memory 230 to the volatile memory 230.

According to various embodiments of the disclosure, the memory controller 225 may transmit and receive information on operation parameters of the volatile memory 230 (e.g., a parameter for changing a refresh rate, a parameter for changing a response speed, a parameter for using a specific function, a parameter not using a specific function, etc.,). Alternatively, the memory controller 225 may read the information on the operation parameters of the volatile memory 230 through a register set (e.g., a MORE register set) or may write the information to the register set. For example, the operation parameter may refer to a parameter for adjusting the timing of each of the signals for controlling the operation of the volatile memory 230 based on the temperatures of the processor 220 and the volatile memory 230. For example, a plurality of frequencies may be configured for at least one signal for performing a specific operation of the volatile memory 230. For example, the signal for performing the specific operation of the volatile memory 230 may have any one of the plurality of frequencies according to circumstances. In this case, the operation parameter may have the same or different configuration value for each of the plurality of frequencies.

According to various embodiments of the disclosure, the memory controller 225 may identify temperature information of the volatile memory 230 and the processor 220. For example, the memory controller 225 may identify the temperature of the processor 220 through the processor temperature sensor 227 included in the processor 220. The memory controller 225 may identify the temperature of the volatile memory 230 based on code information indicating the temperature of the volatile memory 230 received from the volatile memory 230. For example, the code information indicating the temperature of the volatile memory 230 may include information on the temperature of the volatile memory 230 sensed by an electronic device temperature sensor 235 included in the volatile memory 230. Alternatively, the memory controller 225 may identify the temperature of the volatile memory 230 based on at least one of the received code information and product information of the volatile memory 230. In addition, the memory controller 225 may further identify the temperatures of the processor 220 and the volatile memory 230 through a separate volatile memory temperature sensor 260 included in the electronic device 201. The memory controller 225 may identify the temperature of the volatile memory 230 and the temperature of the processor 220, and may determine temperature information of a system including the volatile memory 230 and the processor 220. For example, the temperature information may be based on an average value of the temperature of the volatile memory 230 and the temperature of the processor 220.

According to various embodiments of the disclosure, the memory controller 225 may identify a first temperature section corresponding to the temperature information among a plurality of predetermined temperature sections. For example, the first temperature section may refer to a temperature section including the temperature information of the volatile memory 230 and the processor 220 among the plurality of temperature sections. For example, the plurality of predetermined temperature sections may be automatically designated by the processor 220 or designated by a user. For example, the plurality of temperature sections may include at least one of a very low temperature section (−20 to −10 degrees), a low temperature section (−10 to 0 degrees), a normal section (0 to 40 degrees), a high temperature section (40 to 60 degrees), or a very high temperature section (60 degrees or more). However, the number of temperature sections or the temperature value for classifying the temperature sections may not be limited thereto.

According to various embodiments of the disclosure, the memory controller 225 may perform calibration of the volatile memory 230 and may acquire an operation parameter corresponding to the first temperature section according to calibration. For example, calibration of the volatile memory 230 may include a double data rate (DDR) training operation. For example, calibration may be performed for smooth operation between the processor 220 (e.g., the memory controller 225) and the volatile memory 230. For example, through the calibration, it is possible to configure various parameter values (e.g., CLK to DQS interval timing values of each frequency, a timing value of each of DQS to DQ pins, a voltage value between the processor 220 and the volatile memory 230, a mode regulator value, etc.,) required for the operation between the processor 220 (e.g., the memory controller 225) and the volatile memory 230. For example, when a relationship between a reference CLK and DQS or a relationship between DQS and DQ is changed to a delay value of 10, through calibration according to the surrounding environment, it is possible to identify an optimum point at which the system can operate as stably as possible by changing each relation parameter to 12 or 8 depending on the situation. In this case, the operation parameter corresponding to the operating frequency of the volatile memory 230 may be configured or adjusted based on the optimum point identified by calibration.

According to various embodiments of the disclosure, the processor 220 may perform a calibration operation of the memory controller 225 in the background of the processor 220 (or the system) without performing a system reboot. For example, the processor 220 may control the memory controller 225 to perform a calibration operation including DDR training. The memory controller 225 may store the obtained information on the operation parameter in the storage 250 (e.g., the nonvolatile memory 134 or the data storage device of FIG. 1).

According to various embodiments of the disclosure, the memory controller 225 may perform calibration in the background of the processor 220 without performing a system reboot. The memory controller 225 may store the obtained information on the operation parameter in the storage 250 (e.g., the nonvolatile memory 134 or the data storage device of FIG. 1).

According to various embodiments of the disclosure, when the operation parameter corresponding to the first temperature section is pre-stored in the storage 250, the memory controller 225 may acquire the operation parameter from the storage 250 without performing calibration. According to another embodiment of the disclosure, when calibration for acquiring the operation parameter is not performed for a designated period, the memory controller 225 may perform calibration to acquire a new operation parameter even though the operation parameter is stored in the storage 250. The memory controller 225 may store (or update) the acquired information on the new operation parameter in the storage 250.

According to various embodiments of the disclosure, the memory controller 225 may adjust (or optimize) a timing between signals controlling the operation of the volatile memory 230 based on the operation parameter. For example, the memory controller 225 may determine whether the volatile memory 230 is in an idle state. For example, the idle state may refer to a state in which there is no access to a memory cell included in the volatile memory 230 while the volatile memory 230 is operating. When it is determined that the volatile memory 230 is in the idle state, the memory controller 225 may adjust the timing between the signals controlling the operation of the volatile memory 230 in the idle state. In addition, the memory controller 225 may adjust a timing between signals at a time point when the frequencies of the signals are changed. For example, the memory controller 225 may adjust an interval between a clock signal CLK and first data signal DQS, an interval between the first data signal DQS and second data signal DQ, and/or an interval of each of the second data signals.

According to various embodiments of the disclosure, the memory controller 225 may sequentially or randomly adjust (or optimize) the timing of each of the signals controlling the operation of the volatile memory 230 based on the operation parameter.

According to various embodiments of the disclosure, the memory controller 225 may acquire information on the operation parameter corresponding to each of the plurality of temperature sections from an external electronic device (e.g., the server 108 of FIG. 1). For example, the memory controller 225 may acquire the information on the operation parameter corresponding to each of the plurality of temperature sections in the form of firmware. The memory controller 225 may store the information on the operation parameter corresponding to each of the plurality of temperature sections in the storage 250. In addition, the memory controller 225 may adjust (or optimize) the timing between the signals controlling the operation of the volatile memory 230 based on the information on the operation parameter.

According to various embodiments of the disclosure, the memory controller 225 may adjust the timing between the signals controlling the operation of the volatile memory 230 by using an operation parameter optimized for the temperatures of the processor 222 and the volatile memory 230. Through this, the memory controller 225 may reduce performance degradation of the volatile memory 230 due to a change in the temperature. In addition, the memory controller 225 may prevent the volatile memory 230 from being defective due to the change in the temperature.

Meanwhile, at least some of operations of the electronic device 201 described below may be performed by the processor 220 (or the memory controller 225). However, hereinafter, for convenience of description, it will be described that the electronic device 201 performs an operation.

Figure 3:
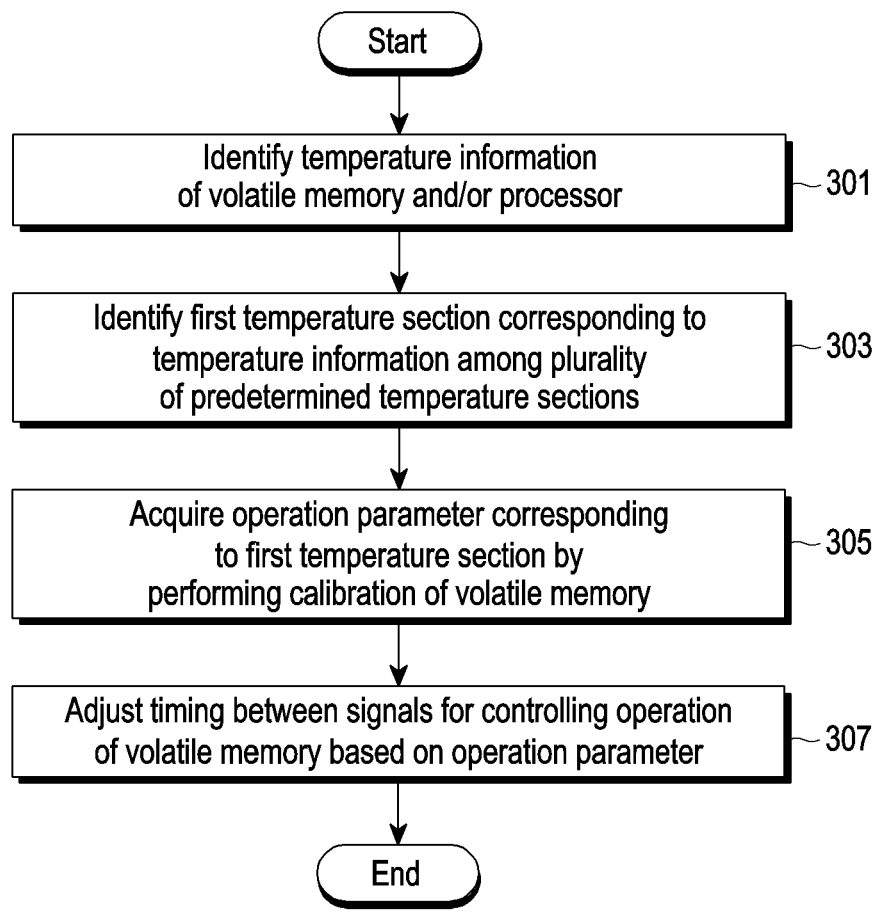
FIG. 3 is a flowchart illustrating an operation in which an electronic device adjusts signals for controlling an operation of a volatile memory according to an embodiment of the disclosure.

FIG. 3 is a flowchart illustrating an operation in which an electronic device adjusts signals for controlling an operation of a volatile memory according to an embodiment of the disclosure.

Referring to FIG. 3, according to various embodiments of the disclosure, in operation 301, the electronic device 201 may identify temperature information of the volatile memory 230 and/or the processor 220. For example, the electronic device 201 may identify the temperatures of the volatile memory 230 and the processor 220, or may identify the temperature of each of the volatile memory 230 or the processor 220. For example, the temperature information may be determined by applying a designated weight to the respective temperatures of the volatile memory 230 and the processor 220, or may be determined as an average value of the respective temperatures of the volatile memory 230 and the processor 220. Alternatively, the temperature information may be based on the temperature of any one of the volatile memory 230 and the processor 220.

According to various embodiments of the disclosure, in operation 303, the electronic device 201 may identify a first temperature section corresponding to the identified temperature information among a plurality of predetermined temperature sections.

According to various embodiments of the disclosure, in operation 305, the electronic device 201 may perform calibration of the volatile memory 230 to acquire an operation parameter corresponding to the first temperature section. For example, the electronic device 201 may perform calibration of the volatile memory 230 in the background of the processor 220, and may acquire the operation parameter corresponding to the first temperature section according to the calibration performance result.

According to various embodiments of the disclosure, in operation 307, the electronic device 201 may adjust a timing between signals for controlling the operation of the volatile memory 230 based on the operation parameter.

Figure 4:
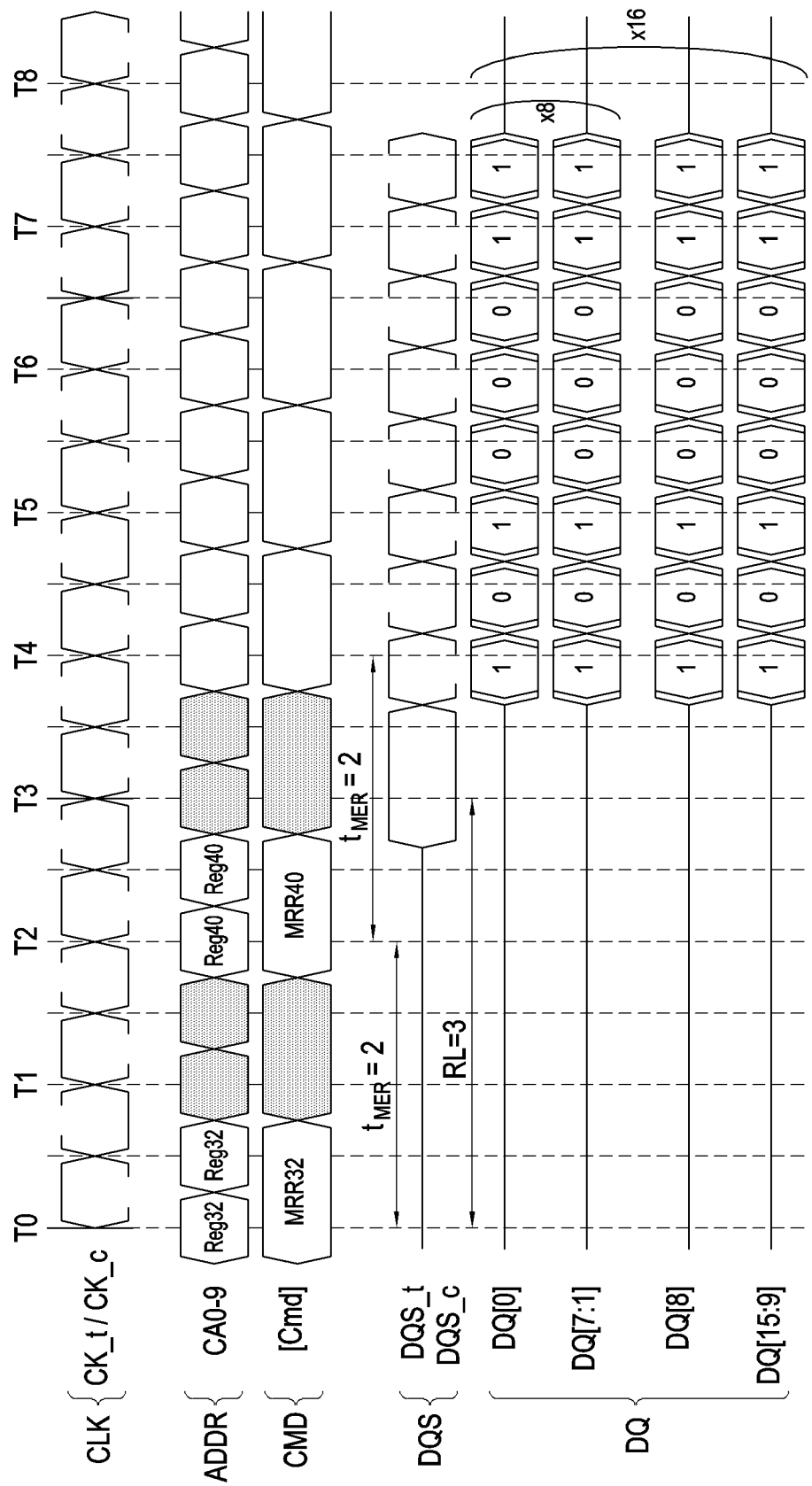
FIG. 4 is a diagram illustrating signals for controlling an operation of a volatile memory according to an embodiment of the disclosure.

FIG. 4 is a diagram illustrating signals for controlling an operation of a volatile memory according to an embodiment of the disclosure.

Referring to FIG. 4, according to various embodiments of the disclosure, the processor 220 (e.g., the memory controller 225) may transmit a clock signal CLK, an address information signal ADDR, a command signal CMD (e.g., a read command or a write command), a first data signal DQS, and/or second data signal DQs to the volatile memory 230.

According to various embodiments of the disclosure, the processor 220 (e.g., the memory controller 225) may adjust a timing between signals based on an operation parameter. For example, the processor 220 may adjust an interval between the clock signal CLK and the first data signal DQS, an interval between the first data signal DQS and the second data signal DQ, and/or an interval of each of the second data signals DQs. For example, the processor 220 may increase or reduce the interval between the clock signal CLK and the first data signal DQS, the interval between the first data signal DQS and the second data signal DQ, and/or the interval of each of the second data signals DQs. Alternatively, the processor 220 may maintain the interval between the clock signal CLK and the first data signal DQS, the interval between the first data signal DQS and the second data signal DQ, and/or the interval of each of the second data signals DQs. Meanwhile, the above-described adjusting of the timing of the signals is only an example, and the technical spirit of the disclosure may not be limited thereto.

Figure 5:
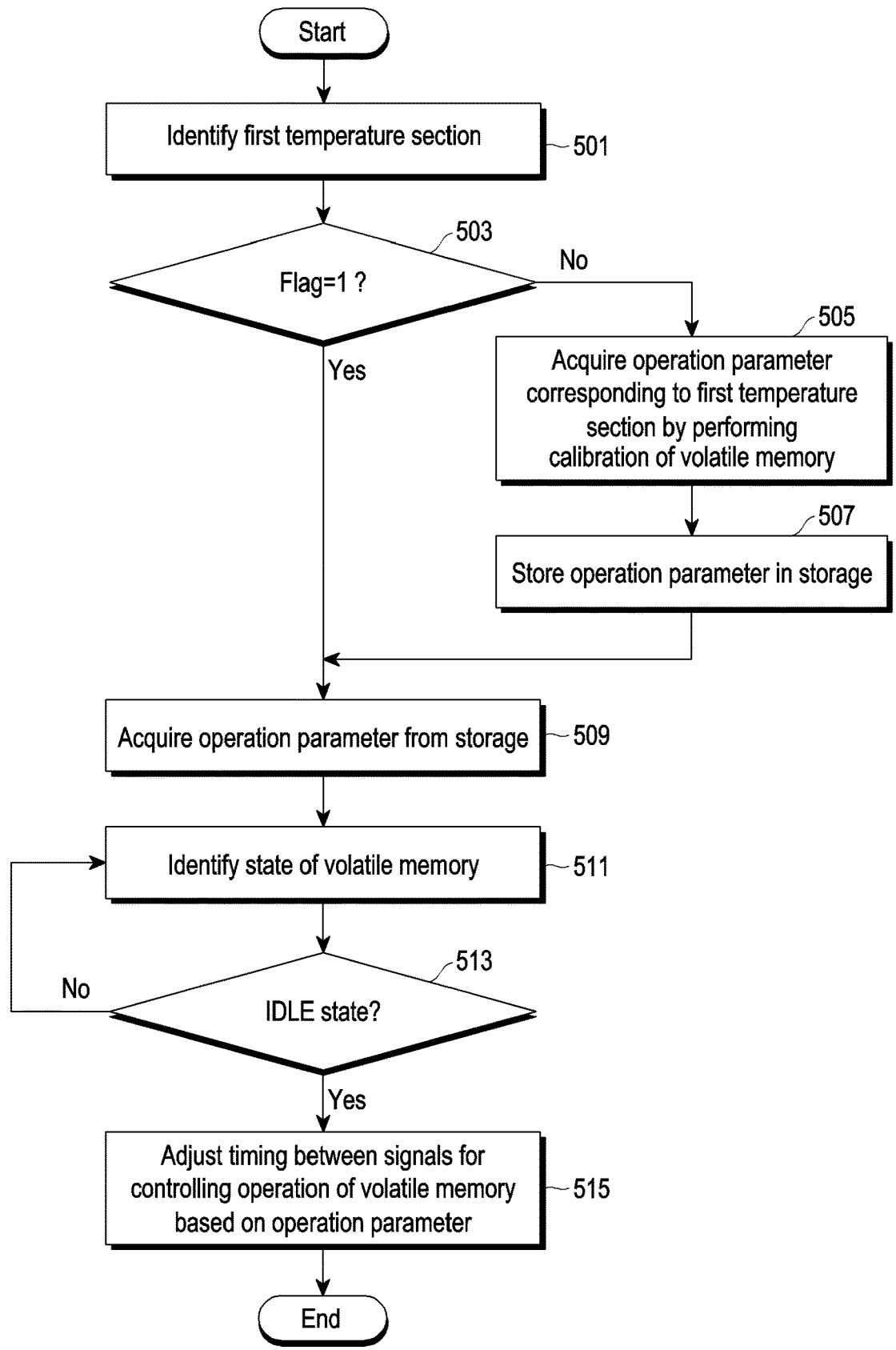
FIG. 5 is a flowchart illustrating an operation in which an electronic device adjusts a timing of each of signals for controlling an operation of a volatile memory based on a temperature section according to an embodiment of the disclosure.

FIG. 5 is a flowchart illustrating an operation in which an electronic device adjusts a timing of each of signals for controlling an operation of a volatile memory based on a temperature section according to an embodiment of the disclosure.

Referring to FIG. 5, according to various embodiments of the disclosure, in operation 501, the electronic device 201 may identify a first temperature section corresponding to the temperature (the temperature of a system including the processor 220 and the volatile memory 230) of the processor 220 and the volatile memory 230.

According to various embodiments of the disclosure, in operation 503, the electronic device 201 may identify a flag value (e.g., Flag=1 or Flag=0) stored in the storage 250. For example, the electronic device 201 may determine whether the flag value is 1. For example, when an operation parameter corresponding to the first temperature section is stored in the storage 250, the electronic device 201 may configure the flag value to 1. Alternatively, when the operation parameter corresponding to the first temperature section is not stored in the storage 250, the electronic device 201 may configure the flag value to 0. In addition, when a predetermined period has elapsed after performing calibration, the electronic device 201 may configure the flag value to 0 even if the operation parameter corresponding to the first temperature section is stored in the storage 250.

According to various embodiments of the disclosure, when it is determined that the flag value is not 1 ("NO" in operation 503), in operation 505, the electronic device 201 may perform calibration of the volatile memory 230 to acquire the operation parameter corresponding to the first temperature section. For example, the electronic device 201 may perform calibration of the volatile memory 230 in the background of the processor 220. In operation 507, the electronic device 201 may store the acquired operation parameter corresponding to the first temperature section in the storage 250.

According to various embodiments of the disclosure, when it is determined that the flag value is 1 ("YES" in operation 503), in operation 509, the electronic device 201 may acquire the operation parameter from the storage 250. According to another embodiment of the disclosure, when it is determined that the flag value is not 1, the electronic device 201 may acquire the operation parameter corresponding to the first temperature section acquired through calibration from the storage 250. Meanwhile, when it is determined that the flag value is not 1, the electronic device 201 may omit operation 509.

According to various embodiments of the disclosure, in operation 511, the electronic device 201 may identify the state of the volatile memory 201. In operation 513, the electronic device 201 may determine whether the state of the volatile memory 201 is an idle state.

According to various embodiments of the disclosure, when it is determined that the state of the volatile memory 201 is the idle state ("YES" in operation 513), in operation 515, the electronic device 201 may adjust a timing between signals for controlling the operation of the volatile memory 230 based on the operation parameter acquired in the idle state. According to another embodiment of the disclosure, when it is determined that the state of the volatile memory 201 is not the idle state ("NO" in operation 513), the electronic device 201 may not adjust the timing between the signals for controlling the operation of the volatile memory 230. For example, the electronic device 201 may wait for the adjusting of the timing until the volatile memory 230 is switched to the idle state.

Figure 6:
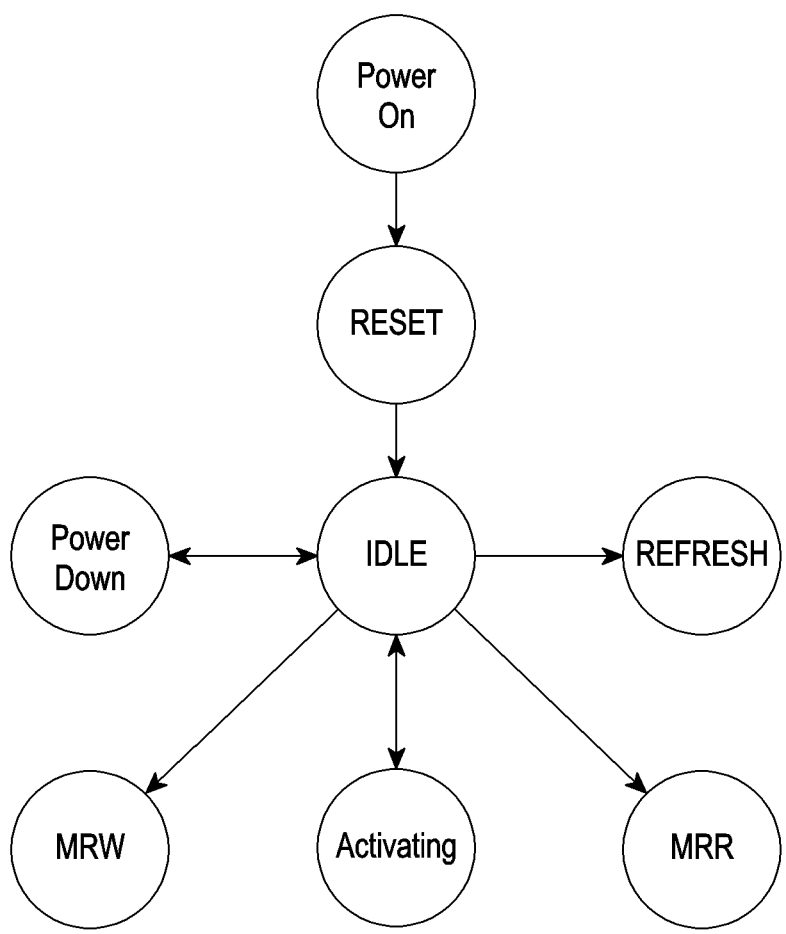
FIG. 6 is a diagram illustrating an operating state of a volatile memory according to an embodiment of the disclosure.

FIG. 6 is a diagram illustrating an operating state of a volatile memory according to an embodiment of the disclosure.

Referring to FIG. 6, according to various embodiments of the disclosure, when power is turned on, the volatile memory 230 may be converted to an idle state through a reset state. For example, the idle state may refer to a state in which the volatile memory 230 does not perform a specific operation.

According to various embodiments of the disclosure, when power is not turned off, the volatile memory 230 may repeatedly perform transitions to an idle state, an activating state for accessing a memory cell included in the volatile memory 230, a refresh state for conserving data stored in the memory cell, and a power down state for saving power. In addition, the volatile memory 230 may be switched to a read (MRR) state in which data is read in order to perform a specific operation and a write (MRW) state in which the state (e.g., temperature) of the volatile memory 230 is updated in a designated register. For example, the volatile memory 230 may periodically update the temperature code of the volatile memory 230 in a designated register according to a polling time.

According to various embodiments of the disclosure, the processor 220 may adjust a timing between signals controlling the operation of the volatile memory 230 based on an operation parameter in the idle state of the volatile memory 230. For example, the processor 220 may apply the newly acquired operation parameter at a time point when the frequency of the signals controlling the operation of the volatile memory 230 is changed.

Figure 7:
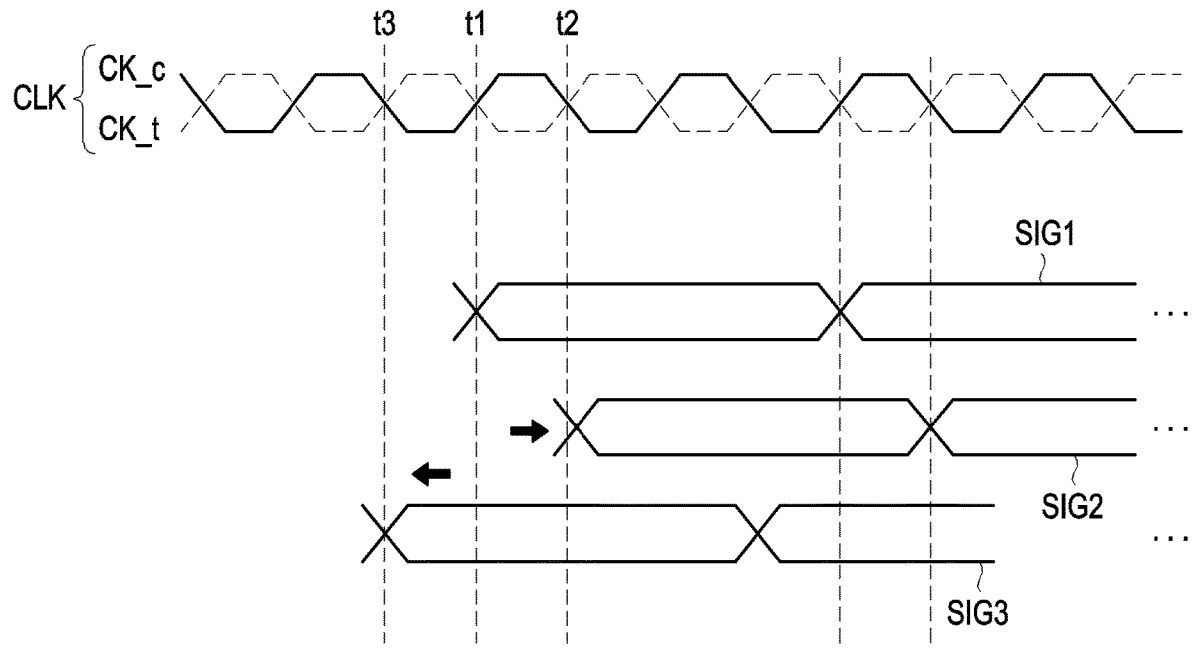
FIG. 7 is a diagram illustrating an operation in which an electronic device adjusts a timing of each of signals for controlling an operation of a volatile memory according to a temperature according to an embodiment of the disclosure.

FIG. 7 is a diagram illustrating an operation in which an electronic device adjusts a timing of each of signals for controlling an operation of a volatile memory according to a temperature according to an embodiment of the disclosure.

Referring to FIG. 7, according to various embodiments of the disclosure, the processor 220 may transmit a clock signal CLK to the volatile memory 230. In addition, the processor 220 may transmit a first signal SIG1, SIG2, or SIG3 according to the clock signal CLK. For example, the processor 220 may output the first signal SIG1 based on an operation parameter acquired at a first temperature, may output the first signal SIG2 based on an operation parameter acquired at a second temperature higher than the first temperature, and may output the first signal SIG3 based on an operation parameter acquired at a third temperature lower than the first temperature.

According to various embodiments of the disclosure, the processor 220 may determine timings of the clock signal CLK and the first signal SIG1 transmitted to the volatile memory 230 at the first temperature (e.g., included in a first temperature section). For example, the processor 220 may transmit the first signal SIG1 to the volatile memory 230 according to a first time point t1 of the clock signal CLK.

According to various embodiments of the disclosure, the electronic device 201 may determine the timings of the clock signal CLK and the first signal SIG2 in the volatile memory 230 at the second temperature (e.g., included in a second temperature section). For example, the processor 220 may transmit the first signal SIG2 to the volatile memory 230 according to a second time point t2 of the clock signal CLK. For example, the second time point t2 may be later than the first time point t1. For example, the processor 220 may delay a timing at which the first signal SIG2 is synchronized with the clock signal CLK as the temperature of the system including the processor 220 and the volatile memory 230 increases.

According to various embodiments of the disclosure, the electronic device 201 may determine the timings of the clock signal CLK and the first signal SIG3 in the volatile memory 230 at the third temperature (e.g., included in a third temperature section). For example, the processor 220 may transmit the first signal SIG3 to the volatile memory 230 according to a third time point t3 of the clock signal CLK. For example, the third time point t3 may be earlier than the first time point t1. For example, the processor 220 may advance a timing at which the first signal SIG3 is synchronized with the clock signal CLK as the temperature of the system including the processor 220 and the volatile memory 230 decreases.

Figure 8:
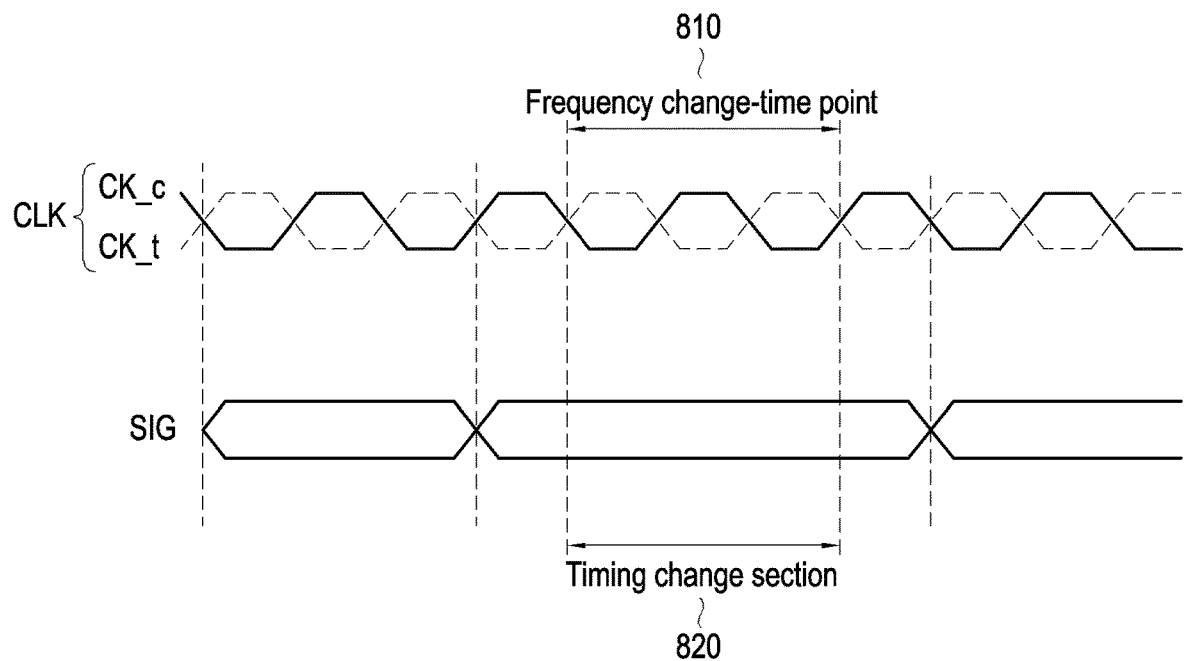
FIG. 8 is a diagram illustrating a timing point at which an electronic device adjusts a timing of each of signals for controlling an operation of a volatile memory according to an embodiment of the disclosure.

FIG. 8 is a diagram illustrating a timing point at which an electronic device adjusts a timing of each of signals for controlling an operation of a volatile memory according to an embodiment of the disclosure.

Referring to FIG. 8, according to various embodiments of the disclosure, the processor 220 may apply an operation parameter acquired (or acquired from the storage 250) by performing calibration at a frequency change-time point 810 at which the frequency of a signal SIG for controlling the operation of the volatile memory 230 is changed. For example, the processor 220 may identify the frequency change-time point 810 at which the operating frequency of the volatile memory 230 is changed, based on a clock signal CLK. The processor 220 may apply the operation parameter to a specific signal SIG for controlling the operation of the volatile memory 230 in a timing change section 820 corresponding to the frequency change-time point 810. The processor 220 may delay or advance the timing of the specific signal SIG by applying the operation parameter to the specific signal SIG.

Figure 9:
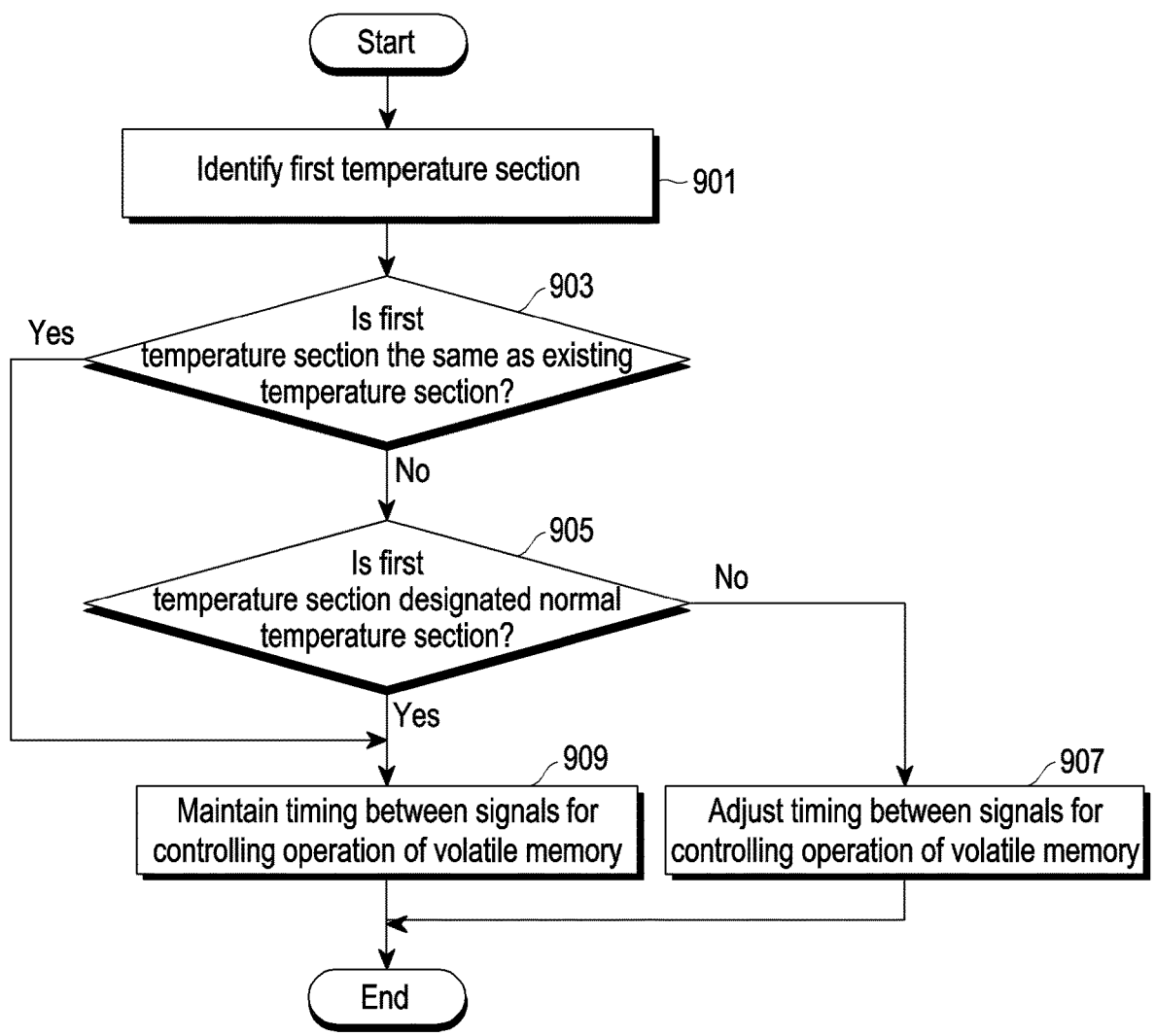
FIG. 9 is a flowchart illustrating an operation in which an electronic device adjusts a timing of each of signals for controlling an operation of a volatile memory based on a temperature section according to an embodiment of the disclosure.

FIG. 9 is a flowchart illustrating an operation in which an electronic device adjusts a timing of each of signals for controlling an operation of a volatile memory based on a temperature section according to an embodiment of the disclosure.

Referring to FIG. 9, according to various embodiments of the disclosure, in operation 901, the electronic device 201 may identify a first temperature section corresponding to the temperatures of the processor 220 and the volatile memory 230 (e.g., the temperature of a system including the processor 220 and the volatile memory 230).

According to various embodiments of the disclosure, in operation 903, the electronic device 201 may determine whether the first temperature section is the same as the existing temperature section.

According to various embodiments of the disclosure, when it is determined that the first temperature section is the same as the existing temperature section ("YES" in operation 903), in operation 909, the electronic device 201 may maintain a timing between signals for controlling the operation of the volatile memory 230. For example, the electronic device 201 may not perform calibration of the volatile memory 230.

According to various embodiments of the disclosure, when it is determined that the first temperature section is not the same as the existing temperature section ("NO" in operation 903), in operation 905, the electronic device 201 may determine whether the first temperature section is a designated normal temperature section. For example, the normal temperature section may be designated by the processor 220 or a user. For example, the normal temperature section may be a section of 10 to 30 degrees.

According to various embodiments of the disclosure, when it is determined that the first temperature section is not the designated normal temperature section ("NO" in operation 905), in operation 907, the electronic device 201 may adjust the timing between the signals for controlling the operation of the volatile memory 230 based on an operation parameter.

According to various embodiments of the disclosure, when it is determined that the first temperature section is the designated normal temperature section ("YES" in operation 905), in operation 909, the electronic device 201 may maintain the timing between the signals for controlling the operation of the volatile memory 230.

Figure 10:
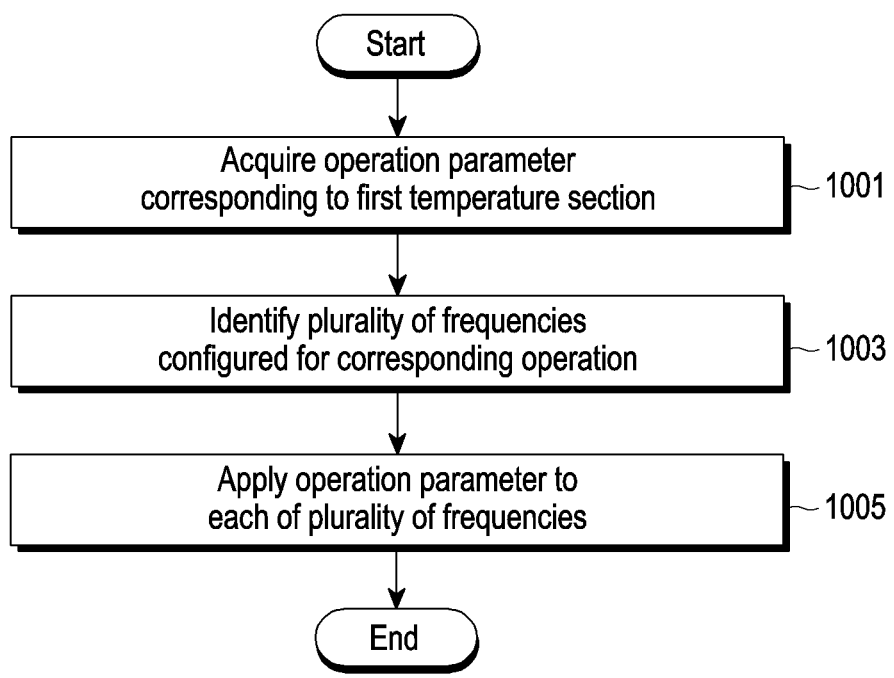
FIG. 10 is a flowchart illustrating an operation in which an electronic device adjusts a timing of each of frequencies included in an operating frequency set of a volatile memory based on an operation parameter according to an embodiment of the disclosure.

FIG. 10 is a flowchart illustrating an operation in which an electronic device adjusts a timing of each of frequencies included in an operating frequency set of a volatile memory based on an operation parameter according to an embodiment of the disclosure.

Referring to FIG. 10, according to various embodiments of the disclosure, in operation 1001, the electronic device 201 may acquire an operation parameter of the volatile memory 230 corresponding to a first temperature section. For example, the electronic device 201 may acquire the operation parameter of the volatile memory 230 by performing calibration. Alternatively, the electronic device 201 may acquire the operation parameter of the volatile memory 230 stored in the storage 250.

According to various embodiments of the disclosure, in operation 1003, the electronic device 201 may identify a plurality of frequencies configured for a corresponding operation of the volatile memory 230. For example, the volatile memory 230 may operate at one or more frequencies of a plurality of frequencies when performing a specific operation. The electronic device 201 may identify a plurality of frequencies configured for a specific operation of the volatile memory 230.

According to various embodiments of the disclosure, in operation 1005, the electronic device 201 may apply the operation parameter to each of the plurality of frequencies. For example, the electronic device 201 may sequentially or randomly apply the operation parameter to each of the plurality of frequencies.

Figure 11:
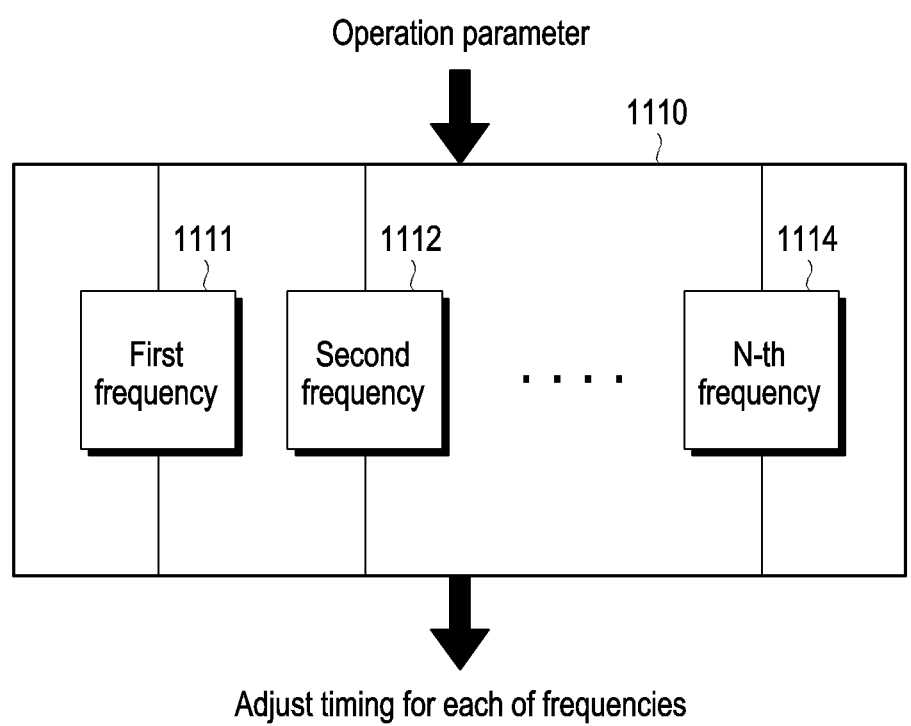
FIG. 11 is a diagram illustrating an operation in which an electronic device adjusts a timing of each of frequencies included in an operating frequency set of a volatile memory based on an operation parameter according to an embodiment of the disclosure.

FIG. 11 is a diagram illustrating an operation in which an electronic device adjusts a timing of each of frequencies included in an operating frequency set of a volatile memory based on an operation parameter according to an embodiment of the disclosure.

Referring to FIG. 11, according to various embodiments of the disclosure, a first operating frequency set 1110 for the volatile memory 230 may include a plurality of frequencies. For example, the first operating frequency set 1110 may include N frequencies (1111, 1112, ..., and 1114, where N is a natural number greater than or equal to 3) that may be changed when a first operation of the volatile memory 230 is performed. For example, when the volatile memory 230 performs the first operation, the volatile memory 230 may operate at one or more frequencies of the frequencies 1111, 1112, and 1114.

According to various embodiments of the disclosure, the electronic device 201 may apply the operation parameter to each of the frequencies 1111, 1112, and 1114 included in the first operation frequency set 1110. Through this, the electronic device 201 may adjust a timing for each of the frequencies 1111, 1112, and 1114 according to the temperature of the system including the processor 220 and the volatile memory 230.

Figure 12:
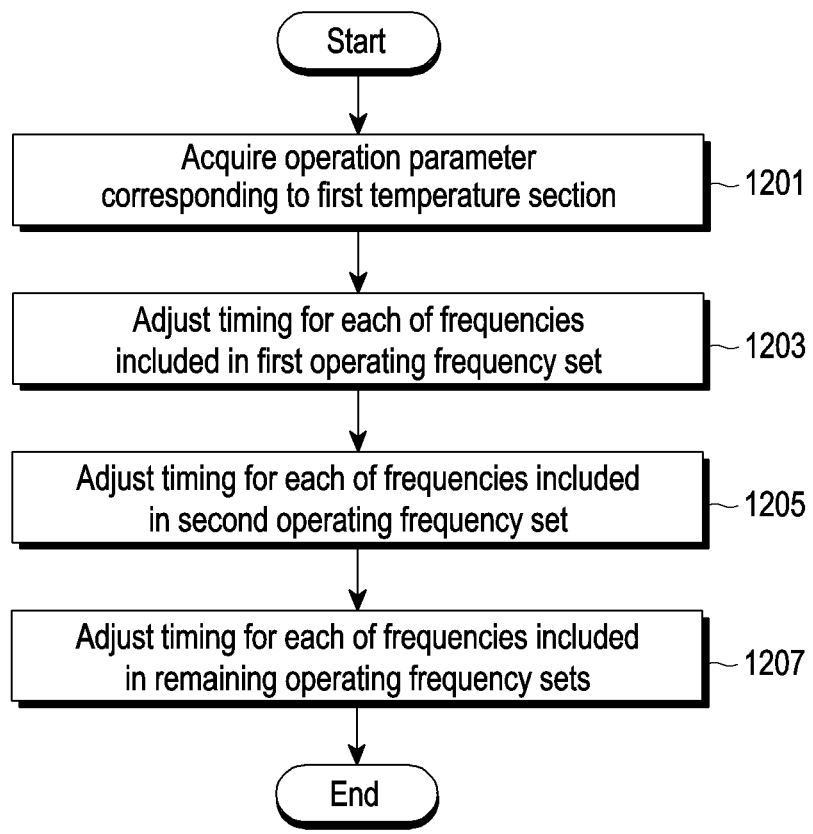
FIG. 12 is a flowchart illustrating an operation in which an electronic device applies an operation parameter to a plurality of operating frequency sets of a volatile memory according to an embodiment of the disclosure.

FIG. 12 is a flowchart illustrating an operation in which an electronic device applies an operation parameter to a plurality of operating frequency sets of a volatile memory according to an embodiment of the disclosure.

Referring to FIG. 12, according to various embodiments of the disclosure, in operation 1201, the electronic device 201 may acquire an operation parameter of the volatile memory 230 corresponding to a first temperature section. For example, the electronic device 201 may acquire the operation parameter of the volatile memory 230 by performing calibration. Alternatively, the electronic device 201 may acquire the operation parameter of the volatile memory 230 stored in the storage 250. The electronic device 201 may apply the operation parameter to each of all frequencies configured for the volatile memory 230. For example, the electronic device 201 may sequentially or randomly apply the operation parameter to each of the plurality of frequencies.

According to various embodiments of the disclosure, in operation 1203, the electronic device 201 may adjust a timing of each of frequencies included in a first operating frequency set.

According to various embodiments of the disclosure, in operation 1205, the electronic device 201 may adjust a timing of each of frequencies included in a second operating frequency set after adjusting the timing of the frequencies included in the first operating frequency set. Similarly, in operation 1207, the electronic device 201 may adjust a timing of each of frequencies included in the remaining operating frequency sets. Through this, the electronic device 201 may apply the operation parameter to each of all frequencies configured for the volatile memory 230.

The electronic device 201 according to various embodiments of the disclosure may include the storage 250, the volatile memory 230, and the processor 220, wherein the processor may be configured to identify temperature information based on a temperature of the volatile memory and a temperature of the processor, to identify a first temperature section corresponding to the temperature information among a plurality of predetermined temperature sections, to perform calibration of the volatile memory to acquire an operation parameter corresponding to the first temperature section, and to adjust a timing between signals for controlling an operation of the volatile memory based on the operation parameter.

According to various embodiments of the disclosure, the processor may be configured to perform the calibration in a background of the processor without performing a system reboot.

According to various embodiments of the disclosure, the processor may be configured to determine whether the volatile memory is in an idle state, and to adjust the timing between the signals in the idle state when the volatile memory is determined to be in the idle state.

According to various embodiments of the disclosure, the processor may be configured to adjust the timing at a time point when a frequency of the signals is changed.

According to various embodiments of the disclosure, the processor may be configured to store information on the operation parameter in the storage.

According to various embodiments of the disclosure, when the operation parameter for the first temperature section is pre-stored in the storage, the processor may be configured to acquire the operation parameter from the storage without performing the calibration.

According to various embodiments of the disclosure, when the calibration is not performed for a designated period, the processor may be configured to acquire a new operation parameter by performing the calibration even if the operation parameter is stored in the storage.

According to various embodiments of the disclosure, the processor may be configured to acquire information on the operation parameter corresponding to each of the predetermined plurality of temperature sections from an external electronic device, and to adjust the timing between the signals for controlling the operation of the volatile memory based on the information on the operation parameter.

According to various embodiments of the disclosure, the processor may be configured to maintain the timing between the signals when the first temperature section is determined to be a designated normal temperature section.

According to various embodiments of the disclosure, the processor may be configured to acquire code information indicating a temperature value of the volatile memory stored in a designated register of the volatile memory, and to identify the temperature of the volatile memory based on at least one of the code information or product information of the volatile memory.

According to various embodiments of the disclosure, the processor may be configured to sequentially or randomly adjust the timing of each of the signals based on the operation parameter.

A method of operating the electronic device 201 according to various embodiments of the disclosure may include identifying temperature information based on a temperature of the volatile memory 230 included in the electronic device and a temperature of the processor 220 included in the electronic device, identifying a first temperature section corresponding to the temperature information among a plurality of predetermined temperature sections, acquiring an operation parameter corresponding to the first temperature section by performing calibration of the volatile memory, and adjusting a timing between signals for controlling the operation of the volatile memory based on an operation parameter.

According to various embodiments of the disclosure, the acquiring of the operation parameter corresponding to the first temperature section may include performing the calibration in a background of the processor without performing a system reboot.

According to various embodiments of the disclosure, the adjusting of the timing between the signals may include determining whether the volatile memory is in an idle state, and adjusting the timing between the signals in the idle state when the volatile memory is determined to be in the idle state.

According to various embodiments of the disclosure, the adjusting of the timing between the signals may include adjusting the timing at a time point when a frequency of the signals is changed.

According to various embodiments of the disclosure, the method of operating the electronic device may further include acquiring the operation parameter from a storage without performing the calibration when the operation parameter for the first temperature section is pre-stored in the storage.

According to various embodiments of the disclosure, when the calibration is not performed for a designated period, the method of operating the electronic device may further include acquiring a new operation parameter by performing the calibration even if the operation parameter is stored in the storage.

According to various embodiments of the disclosure, the method of operating the electronic device may further include acquiring information on the operation parameter corresponding to each of the predetermined plurality of temperature sections from an external electronic device, and adjusting the timing between the signals for controlling the operation of the volatile memory based on the information on the operation parameter.

According to various embodiments of the disclosure, the acquiring of the temperature information may further include acquiring code information indicating a temperature value of the volatile memory stored in a designated register of the volatile memory, and identifying the temperature of the volatile memory based on at least one of the code information or product information of the volatile memory.

A non-transitory recording medium according to various embodiments of the disclosure may store a program capable of performing identifying temperature information based on a temperature of the volatile memory 230 included in an electronic device and a temperature of the processor 220 included in the electronic device 201, identifying a first temperature section corresponding to the temperature information among a plurality of predetermined temperature sections, acquiring an operation parameter corresponding to the first temperature section by performing calibration of the volatile memory, and adjusting a timing between signals for controlling the operation of the volatile memory based on an operation parameter.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a storage storing one or more computer programs;
   a volatile memory; and
   a processor communicatively coupled to the storage and the volatile memory,
   wherein the one or more computer programs include computer-executable instructions that, when executed by the processor, cause the electronic device to:
      identify temperature information of the electronic device based on at least one of a first temperature of the volatile memory or a second temperature of the processor,
      identify a first temperature section corresponding to the temperature information, from among a plurality of predetermined temperature sections of the electronic device,
      identify whether an operation parameter, which corresponds to the first temperature section, is pre-stored in the storage, the operation parameter being a parameter for adjusting at least one signal among a plurality of signals communicated between the processor and the volatile memory that are used for operation of the volatile memory, the plurality of signals communicated between the processor and the volatile memory being output according to at least one clock signal communicated between the processor and the volatile memory that is used for operation of the volatile memory,
      based on identifying that the operation parameter, which corresponds to the first temperature section, is not pre-stored in the storage, acquire a first operation parameter that corresponds to the first temperature section,
      based on identifying that the operation parameter, which corresponds to the first temperature section, is pre-stored in the storage, acquire the operation parameter that is identified as being pre-stored in the storage as a second operation parameter that corresponds to the first temperature section, and
      perform a calibration of the volatile memory by adjusting, based on one of the first operation parameter or the second operation parameter, a timing at which the at least one signal, among the plurality of signals communicated between the processor and the volatile memory that are used for operation of the volatile memory, is output,
   wherein the at least one signal is output at a time point of the at least one clock signal that is earlier or later than a previous time point of the at least one clock signal, when the timing at which the at least one signal is output is adjusted based on the one of the first operation parameter or the second operation parameter, and
   wherein the calibration is performed as a background operation of the processor without performing a system reboot.

2. The electronic device of claim 1, wherein the one or more computer programs further include computer-executable instructions that, when executed by the processor, cause the electronic device to:
   determine whether the volatile memory is in an idle state, and
   adjust the time point of the at least one clock signal at which the at least one signal is output, when the volatile memory is determined to be in the idle state.

3. The electronic device of claim 2, wherein the one or more computer programs further include computer-executable instructions that, when executed by the processor, cause the electronic device to:
   adjust, the time point of the at least one clock signal at which the at least one signal is output, at a time point of the at least one clock signal when a frequency of the at least one signal is changed.

4. The electronic device of claim 1, wherein the one or more computer programs further include computer-executable instructions that, when executed by the processor, cause the electronic device to:
   store the first operation parameter in the storage.

5. The electronic device of claim 1, wherein the one or more computer programs further include computer-executable instructions that, when executed by the processor, cause the electronic device to:
   when the calibration is not performed for a designated period, acquire the first operation parameter, even if it is identified that the operation parameter is pre-stored in the storage.

6. The electronic device of claim 1, wherein the one or more computer programs further include computer-executable instructions that, when executed by the processor, cause the electronic device to:
   acquire, from an external electronic device, operation parameters that each correspond to one of the plurality of predetermined temperature sections, and
   adjust, based on one of the operation parameters acquired from the external electronic device, the time point of the at least one clock signal at which the at least one signal is output.

7. The electronic device of claim 1, wherein the one or more computer programs further include computer-executable instructions that, when executed by the processor, cause the electronic device to:
   maintain the time point of the at least one clock signal at which the at least one signal is output, when the first temperature section is determined to be a designated normal temperature section.

8. The electronic device of claim 1, wherein the one or more computer programs further include computer-executable instructions that, when executed by the processor, cause the electronic device to:

acquire code information indicating a temperature value of the volatile memory stored in a designated register of the volatile memory, and identify the second temperature of the volatile memory based on at least one of the code information or product information of the volatile memory.

9. The electronic device of claim 1, wherein the one or more computer programs further include computer-executable instructions that, when executed by the processor, cause the electronic device to:

sequentially or randomly adjust, based on the one of the first operation parameter or the second operation parameter, the time point of the at least one clock signal at which the at least one signal is output.

10. The electronic device of claim 1, wherein the one or more computer programs further include computer-executable instructions that, when executed by the processor, cause the electronic device to:

apply different weights to the first temperature and the second temperature, and wherein the temperature information is identified based on the first temperature and the second temperature, to which the different weights are applied.

11. The electronic device of claim 1, wherein the operation parameter has a different configuration value for each of a plurality of frequencies.

12. The electronic device of claim 1, wherein different operation parameters correspond to the plurality of predetermined temperature sections, respectively.

13. A method performed by an electronic device, the method comprising:

identifying temperature information of the electronic device based on at least one of a first temperature of a volatile memory of the electronic device or a second temperature of a processor of the electronic device;

identifying a first temperature section corresponding to the temperature information, from among a plurality of predetermined temperature sections of the electronic device;

identifying whether an operation parameter, which corresponds to the first temperature section, is pre-stored in a storage of the electronic device, the operation parameter being a parameter for adjusting at least one signal among a plurality of signals communicated between the processor and the volatile memory that are used for operation of the volatile memory, the plurality of signals communicated between the processor and the volatile memory being output according to at least one clock signal communicated between the processor and the volatile memory that is used for operation of the volatile memory;

based on identifying that the operation parameter, which corresponds to the first temperature section, is not pre-stored in the storage, acquiring a first operation parameter that corresponds to the first temperature section;

based on identifying that the operation parameter, which corresponds to the first temperature section, is pre-stored in the storage, acquiring the operation parameter that is identified as being pre-stored in the storage as a second operation parameter that corresponds to the first temperature section; and performing a calibration of the volatile memory by adjusting, based on one of the first operation parameter or the second operation parameter, a timing at which the at least one signal, among the plurality of signals communicated between the processor and the volatile memory that are used for operation of the volatile memory, is output, wherein the at least one signal is output at a time point of the at least one clock signal that is earlier or later than a previous time point of the at least one clock signal, when the timing at which the at least one signal is output is adjusted based on the one of the first operation parameter or the second operation parameter, and wherein the calibration is performed as a background operation of the processor without performing a system reboot.

14. The method of claim 13, wherein the adjusting of the time point of the at least one clock signal at which the at least one signal is output comprises:

determining whether the volatile memory is in an idle state; and adjusting the time point of the at least one clock signal at which the at least one signal is output, when the volatile memory is determined to be in the idle state.

15. The method of claim 14, wherein the adjusting of the time point of the at least one clock signal at which the at least one signal is output comprises adjusting, the time point of the at least one clock signal at which the at least one signal is output, at a time point of the at least one clock signal when a frequency of the at least one signal is changed.

16. The method of claim 13, further comprising:

when the calibration is not performed for a designated period, acquiring the first operation parameter, even if it is identified that the operation parameter is pre-stored in the storage.

17. The method of claim 13, further comprising:

acquiring, from an external electronic device, operation parameters that each correspond to one of the plurality of predetermined temperature sections; and adjusting, based on one of the operation parameters acquired from the external electronic device, the time point of the at least one clock signal at which the at least one signal is output.

18. The method of claim 13, wherein the acquiring of the temperature information further comprises:

acquiring code information indicating a temperature value of the volatile memory stored in a designated register of the volatile memory; and identifying the second temperature of the volatile memory based on at least one of the code information or product information of the volatile memory.

19. One or more non-transitory computer-readable storage media storing one or more computer programs including computer-executable instructions that, when executed by a processor of an electronic device, cause the electronic device to perform operations, the operations comprising:

identifying temperature information of the electronic device based on at least one of a first temperature of a volatile memory of the electronic device and a second temperature of the processor;

identifying a first temperature section corresponding to the temperature information, from among a plurality of predetermined temperature sections of the electronic device;

identifying whether an operation parameter, which corresponds to the first temperature section, is pre-stored in a storage of the electronic device, the operation parameter being a parameter for adjusting at least one signal among a plurality of signals communicated between the processor and the volatile memory that are used for operation of the volatile memory, the plurality of signals communicated between the processor and the volatile memory being output according to at least one clock signal communicated between the processor and the volatile memory that is used for operation of the volatile memory;

based on identifying that the operation parameter, which corresponds to the first temperature section, is not pre-stored in the storage, acquiring a first operation parameter that corresponds to the first temperature section;

based on identifying that the operation parameter, which corresponds to the first temperature section, is pre-stored in the storage, acquiring the operation parameter that is identified as being pre-stored in the storage as a second operation parameter that corresponds to the first temperature section; and performing a calibration of the volatile memory by adjusting, based on one of the first operation parameter or the second operation parameter, a timing at which the at least one signal, among the plurality of signals communicated between the processor and the volatile memory that are used for operation of the volatile memory, is output, wherein the at least one signal is output at a time point of the at least one clock signal that is earlier or later than a previous time point of the at least one clock signal, when the timing at which the at least one signal is output is adjusted based on the one of the first operation parameter or the second operation parameter.

\* \* \* \* \*